United States Patent
Kim et al.

(10) Patent No.: US 10,429,986 B2
(45) Date of Patent: Oct. 1, 2019

(54) TOUCH SCREEN PANEL AND DISPLAY DEVICE COMPRISING THE SAME

(71) Applicant: LG DISPLAY CO., LTD., Seoul (KR)

(72) Inventors: Jinyeol Kim, Sangju-si (KR); Seunghyun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/282,490

(22) Filed: Sep. 30, 2016

(65) Prior Publication Data

US 2017/0090661 A1 Mar. 30, 2017

(30) Foreign Application Priority Data

Sep. 30, 2015 (KR) .................. 10-2015-0137883

(51) Int. Cl.
| | |
|---|---|
| G06F 3/041 | (2006.01) |
| G06F 3/044 | (2006.01) |
| H01L 27/32 | (2006.01) |
| H01L 51/00 | (2006.01) |

(52) U.S. Cl.
CPC ............ *G06F 3/0416* (2013.01); *G06F 3/044* (2013.01); *G06F 3/0412* (2013.01); *H01L 27/323* (2013.01); *H01L 27/3258* (2013.01); *H01L 27/3276* (2013.01); *H01L 51/0097* (2013.01); *G06F 2203/04104* (2013.01); *G06F 2203/04108* (2013.01); *G06F 2203/04111* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 2013/0082984 | A1* | 4/2013 | Drzaic | ..................... G09G 3/20 345/204 |
| 2015/0060933 | A1* | 3/2015 | Ohno | .................. H01L 51/5237 257/99 |
| 2015/0230331 | A1* | 8/2015 | Lee | ...................... H05K 1/0259 361/220 |
| 2016/0306460 | A1* | 10/2016 | Lee | ....................... H01L 27/323 |

FOREIGN PATENT DOCUMENTS

| | | |
|---|---|---|
| CN | 104425319 A | 3/2015 |
| KR | 10-2013-0053938 A | 5/2013 |
| WO | WO2009/140258 A1 | 11/2009 |

* cited by examiner

*Primary Examiner* — Stephen T. Reed
(74) *Attorney, Agent, or Firm* — Birch, Stewart, Kolasch & Birch, LLP

(57) ABSTRACT

A touch screen panel according to an embodiment includes a base film having a display region and a bent non-display region located on the outside of the display region, touch electrodes provided in the display region, touch pads provided on one edge of the non-display region, and routing wires that extend along the front or back of the bent non-display region and electrically connect the touch electrodes and the touch pads.

10 Claims, 10 Drawing Sheets

(a)

(b)

(a)

(b)

TOUCH SCREEN PANEL AND DISPLAY DEVICE COMPRISING THE SAME

This application claims the priority benefit of Korean Patent Application No. 10-2015-0137883 filed on Sep. 30, 2015, which is incorporated herein by reference for all purposes as if fully set forth herein.

BACKGROUND OF THE INVENTION

Field of the Invention

This document relates to a touch screen panel with a bent non-display region and a display device comprising the same.

Discussion of the Related Art

User interfaces (UI) enable humans (users) to interact with various types of electrical and electronic devices and easily control them as they want. Typical examples of the user interfaces include keypads, keyboards, mice, on-screen displays (OSD), and remote controllers with an infrared communication capability or radio frequency (RF) communication capability. The user interface technology is continuously developing to improve user sensation and ease of operation. Recently, user interfaces have been evolving into touch UI, voice recognition UI, 3D UI, etc.

The touch UI has been indispensably used in portable information appliances, and moreover it has been extensively applied in almost all types of home appliances. A capacitive touch sensing system can be used in a variety of applications, with its touch screen panel structure that offers higher durability and optical clarity than a traditional resistive touch sensing system and is capable of multi-touch detection and hover detection.

Hereinafter, a touch screen panel and an organic light-emitting diode display comprising the same will be described with reference to FIGS. 1 and 2. FIG. 1 is a perspective view schematically illustrating a touch screen panel according to the related art. FIG. 2 is a view taken along line I-I' of FIG. 1, which is a cross-sectional view schematically illustrating an organic light-emitting diode display comprising a touch screen panel according to the related art.

Referring to FIG. 1, a touch screen panel TSP comprises an electrode portion AA, a routing wiring portion NA, a pad portion PA, and a driving portion.

The electrode portion AA (or display region) comprises a plurality of touch sensors formed on a base film BF. The routing wiring portion NA (or non-display region) is located on the outside of the electrode portion AA. The routing wiring portion NA comprises a plurality of routing wires respectively connected to the touch sensors in the electrode portion AA. The pad portion PA is placed on one side of the base film BF. The pad portion PA comprises a plurality of pads respectively and electrically connected to the plurality of touch sensors through the plurality of routing wires. The driving portion comprises a touch integrated circuit and a flexible film LF. The touch integrated circuit sends and receives a touch signal for activating the touch sensors in synchronization with a control signal from a main board. To this end, one end of the flexible film LF is electrically connected to the pad portion PA of the base film BF, and the other end is electrically connected to the main board.

Referring further to FIG. 2, the organic light-emitting diode display according to the related art comprises a touch screen panel TSP and a display panel DP. The display comprises a display region AA where an image is implemented and a non-display region NA located on the outside of the display region AA.

The display panel DP comprises a thin-film transistor array TFA that has one or more thin-film transistors placed on a substrate SUB and organic light-emitting diodes electrically connected to the thin-film transistors. An organic light-emitting diode comprises an anode electrically connected to a thin-film transistor, a cathode placed opposite the anode, and an organic emissive layer interposed between the anode and cathode.

The touch screen panel TSP is placed on the display panel DP. The touch screen panel TSP comprises a first electrode Tx and second electrode Rx intersecting each other, with the base film BF between them. The first electrode Tx and the second electrode Rx are insulated from each other by the base film BF. Touch pads are placed on one end of the base film BF. The touch pads are connected to the first electrode Tx and second electrode Rx via routing wires. The touch pads are electrically connected to the driving portion.

The touch screen panel TSP and the display panel DP may be bonded together by an adhesive layer PSA interposed between them. A polarizing film POL is placed on the display region AA of the touch screen panel TSP.

Recently, an effort to reduce the bezel area BZ is under way to achieve a narrow bezel. But, it is necessary to make enough space for the pad portion PA and the driving portion, as well as the display region AA for implementing an input image, on a display device with a touch screen panel TSP. This space corresponds to the bezel area BZ, thus posing limitations when it comes to reducing the bezel area BZ when process margin, etc. is taken into account.

For example, the pad portion PA comprises a plurality of touch pads. To prevent damage to the polarizing film POL which may occur in a thermal compression process for bonding the touch pads and the flexible film LF, a preset process margin A is required between the touch pads and the polarizing film POL. The touch pads should be of sufficient width and length, in order to provide enough space B1 to avoid poor contact with terminals provided on the flexible film LF, taking into account alignment and process deviations from the terminals. Moreover, it is necessary to put a preset cutting margin B2 with respect to the edge of the base film BF in a blanking (or compressing) process for forming the touch pads. In addition, the flexible film LF connected to the touch pads is bent and placed around the edge of the base film BF, so there should be some space C between the edge of the base film BF and the flexible film LF.

As such, the organic light-emitting diode display comprising the touch screen panel TSP according to the related art has limitations in reducing the bezel area BZ without any structural changes since the above-described components have their own process margin in the non-display region NA.

SUMMARY

The present invention has been made in an effort to provide a touch screen panel which has a narrow bezel by bending a non-display region, and an organic light-emitting diode display comprising the same.

A touch screen panel according to an embodiment of the present invention can include a base film having a display region and a bent non-display region located on the outside of the display region, touch electrodes provided in the display region, touch pads provided on one edge of the non-display region, and routing wires that extend along the front or back of the bent non-display region and electrically connect the touch electrodes and the touch pads.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing various embodiments, descriptions of the same or like parts will be made representatively in a first exemplary embodiment, but omitted in other embodiments.

Figure 3:
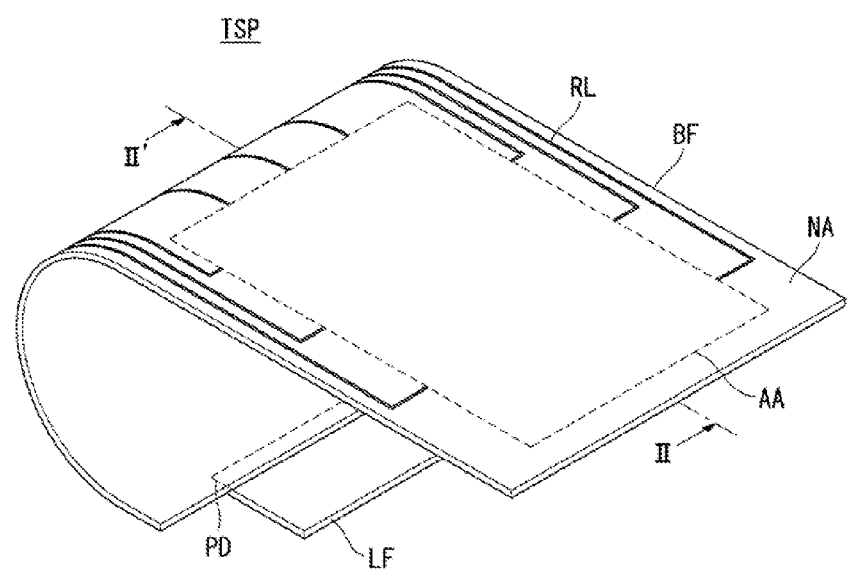
FIG. 3 is a perspective view schematically illustrating a touch screen panel according to an embodiment of the present invention.

Hereinafter, a touch screen panel TSP according to the present invention will be described with reference to FIG. 3. FIG. 3 is a perspective view schematically illustrating a touch screen panel according to the present invention. All the components of the touch screen panel according to all embodiments of the present invention are operatively coupled and configured.

Referring to FIG. 3, the touch screen panel TSP according to the present invention comprises touch sensors formed on a base film BF, routing wires RL connected to the touch sensors, and touch pads PD connected to the routing wires RL.

The base film BF is made of a flexible material that can bend. For example, the base film BF may comprise, but is not limited to, polyimide, polyethyelene terephthalate (PET), poly carbonate (PC), cyclic olefin polymer (COP), cellulose acetate propionate (CAP), polyethersulphone (PES), polyacrylate (PAR), polyetherimide (PEI), polyethyelenen napthalate (PEN), polyphenylene sulfide (PPS), polyallylate, cellulose triacetate (TAC), etc.

The base film BF comprises a display region AA where touch sensors are placed and a non-display region NA located on the outside of the display region AA. The display region AA corresponds to an image display region on the display panel. The display region AA has a planar shape. The non-display region NA has a curved shape as it is bent and flexed. The non-display region NA of the base film BF is bent towards the back of the touch screen panel TSP. The surface of the touch screen panel which is in contact with or close to a conductor when there is a touch input is assumed to be the front, and the opposite surface is defined as the back.

A plurality of touch sensors are placed in the display region AA. The touch sensors may comprise at least either self-capacitance sensors or mutual capacitance sensors. A mutual capacitance sensor comprises mutual capacitance that occurs between two electrodes. In a mutual capacitance sensing circuit, a driving signal (or stimulus signal) is applied to one of the two electrodes, and touch input is sensed through the other electrode, based on a change in the amount of electric charge at the mutual capacitance. When a conductor comes close to the mutual capacitance, the amount of electric charge at the mutual capacitance is reduced. In this way, touch input or gestures can be detected.

A self-capacitance sensor comprises self-capacitance that occurs at each sensor electrode. In a self-capacitance sensing circuit, an electric charge is supplied to each sensor electrode, and touch input is detected based on a change in the amount of electric charge at the self-capacitance. When a conductor comes close to the self-capacitance, the capacitance increases as the capacitance caused by the conductor is connected in parallel to the capacitance of the sensor. That is, in the self-capacitance sensing circuit, the capacitance of the sensor increases when touch input is detected.

Touch electrodes constituting the touch sensors may be provided on the front or back of the base film BF. That is, in the present invention, the touch electrodes are placed on either the front or back of the display region AA. In this case, the thickness of the base film BF may be reduced, compared to the touch electrodes placed on both sides of the base film BF with the base film BF in between them. Normally, a roll-to-roll process is performed in order to form a driving electrode, to which a driving signal is applied, and a sensing electrode for sensing a change in the amount of electric charge, on both sides of the base film BF. Since a considerable amount of pressure is provided to the base film BF in the roll-to-roll process, the base film BF should be of a certain thickness or greater to endure the pressure. If the thickness of the base film BF increases, it is difficult to bend the non-display region NA of the base film BF. Accordingly, the touch screen panel TSP according to the present invention may comprise a base film BF that has a minimum thickness allowed for the process, by placing the touch electrodes constituting the touch sensors on either the front or back of the base film BF. Therefore, the present invention can give flexibility to the base film BF.

A plurality of routing wires RL connected to the touch sensors in the display region AA are placed in the non-display region NA. The touch pads PD are placed on one edge of the non-display region NA. One end of the routing wires RL is connected to the touch sensors, and the other end of the routing wires RL is connected to the touch pads PD.

The routing wires RL extend from the touch sensors along the front or back of the bent non-display region NA. The routing wires RL may be made of flexible material. For example, the routing wires may comprise, but are not limited to, one of the following: metal nano wires, metal meshes, and carbon nano tubes (CNT). The routing wires RL may have a minimum line width and minimum distance between each that are allowed for the process, in order to minimize the bezel area. But, the line width and thickness of the routing wires may be determined in consideration of resistance. The routing wires RL may be made of flexible material.

The touch pads PD are located on the back of the display region AA. The touch pads PD are electrically connected to the driving portion on the back of the display region AA. The driving portion comprises a touch integrated circuit and a flexible film LF. The flexible film LF is electrically connected to the touch pads PD of the base film BF. The flexible film LF and the touch pads PD may be bonded by FOG (film on glass) or TAB (tape automated bonding). The touch integrated circuit may be mounted on the flexible film LF by TCP (tape carrier package) or COF (chip on film). The flexible film LF may be a FPCB (flexible printed circuit board).

The touch integrated circuit sends and receives a touch signal for activating the touch sensors in synchronization with a control signal from a main board. To this end, one end of the flexible film LF is electrically connected to the touch pads PD of the base film BF, and the other end is electrically connected to the main board. To electrically connect one end of the flexible film LF and the touch pads PD, an ACF (anisotropic conductive film) may be interposed between the touch pads PD and the terminals of the flexible film LF.

First Exemplary Embodiment

Figure 4:
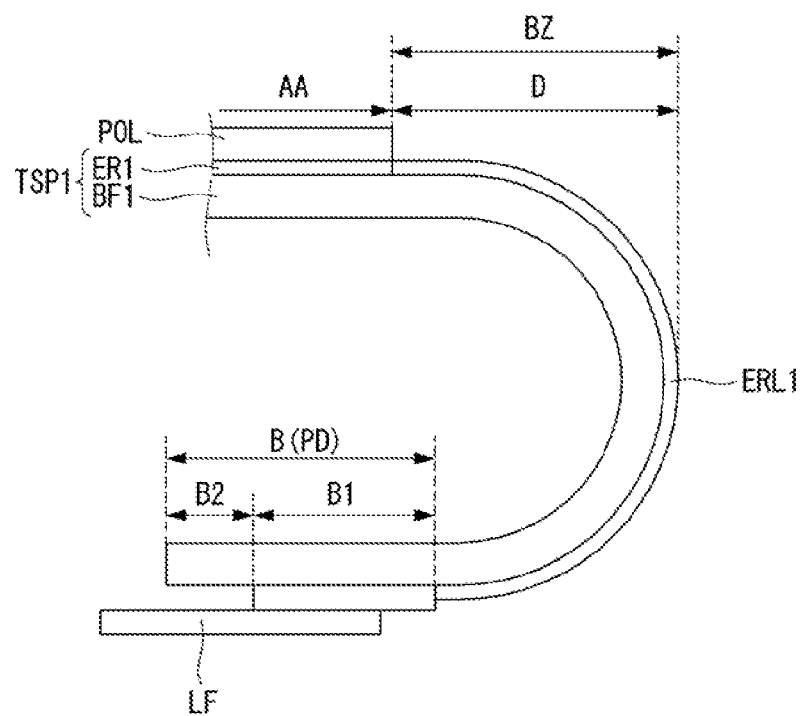
FIG. 4 is a view taken along line II-II' of FIG. 3, which is a cross-sectional view schematically illustrating a touch screen panel according to the present invention.
Figure 5:
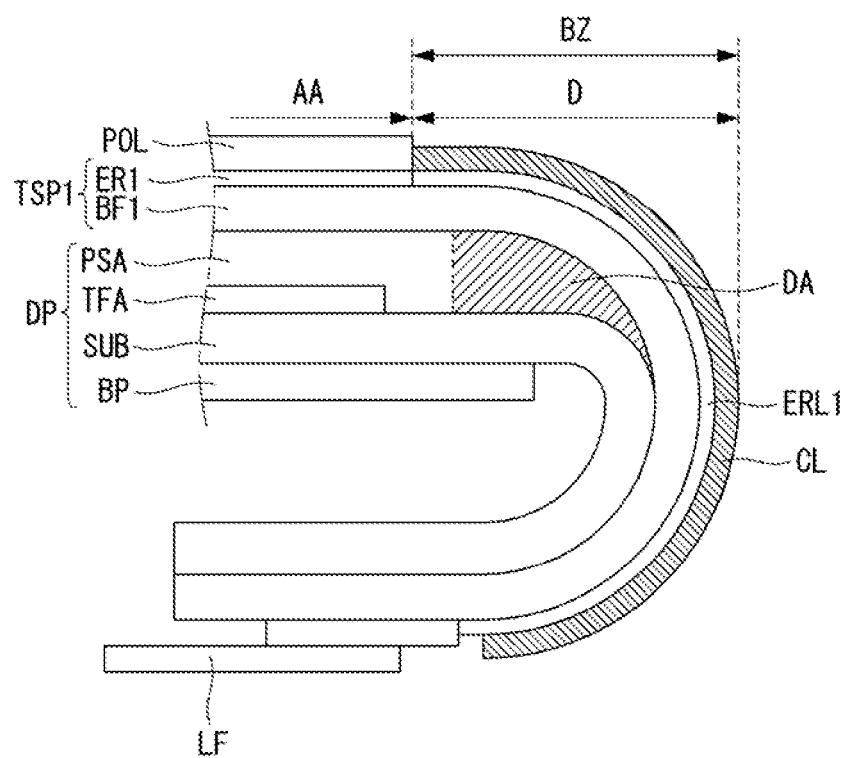
FIG. 5 is a view taken along line II-II' of FIG. 3, which is a cross-sectional view schematically illustrating an organic light-emitting diode display comprising a touch screen panel according to the present invention.

Hereinafter, a touch screen panel TSP1 and an organic light-emitting diode display comprising the same according to a first exemplary embodiment of the present invention will be described with reference to FIGS. 4 and 5. FIG. 4 is a view taken along line II-II' of FIG. 3, which is a cross-sectional view schematically illustrating a touch screen panel according to the present invention. FIG. 5 is a view taken along line II-II' of FIG. 3, which is a cross-sectional view schematically illustrating an organic light-emitting diode display comprising a touch screen panel according to the present invention.

Referring to FIG. 4, the touch screen panel TSP according to the first exemplary embodiment of the present invention comprises a base film BF1, touch electrodes ER1, touch pads PD, and routing wires ERL1.

The base film BF1 comprises a display region AA and a non-display region NA located on the outside of the display region AA. The touch electrodes ER1 are placed on the front of the base film BF1 in the display region AA. The touch pads PD are placed on the front of one edge of the base film BF1, in the non-display region NA. The routing wires ERL1 are placed on the front of the base film BF1. One end of the routing wires ERL1 is connected to the touch electrodes ER1, and the other end is connected to the touch pads PD.

The non-display region NA of the base film BF1 is bent towards the back of the display region AA. The display region AA of the base film BF1 maintains the planar shape. The touch pads PD are located on the back of the display region AA. Accordingly, the flexible film LF connected to the touch pads PD may be placed opposite the back of the display region AA. The routing wires ERL1 extend along the outer perimeter of the non-display region NA and are connected to the touch pads PD.

In the first exemplary embodiment of the present invention, the bezel area BZ runs the distance D from the boundary between the display region AA and the non-display region NA to the most protruding part of the outer perimeter. To reduce the bezel area BZ, the outer perimeter may have a large radius of curvature.

Figure 1:
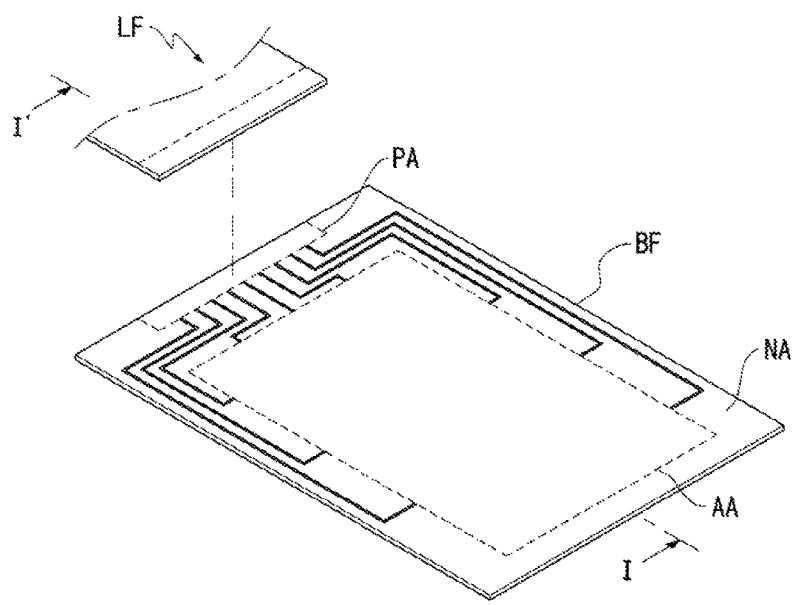
FIG. 1 is a perspective view schematically illustrating a touch screen panel according to the related art.
Figure 2:
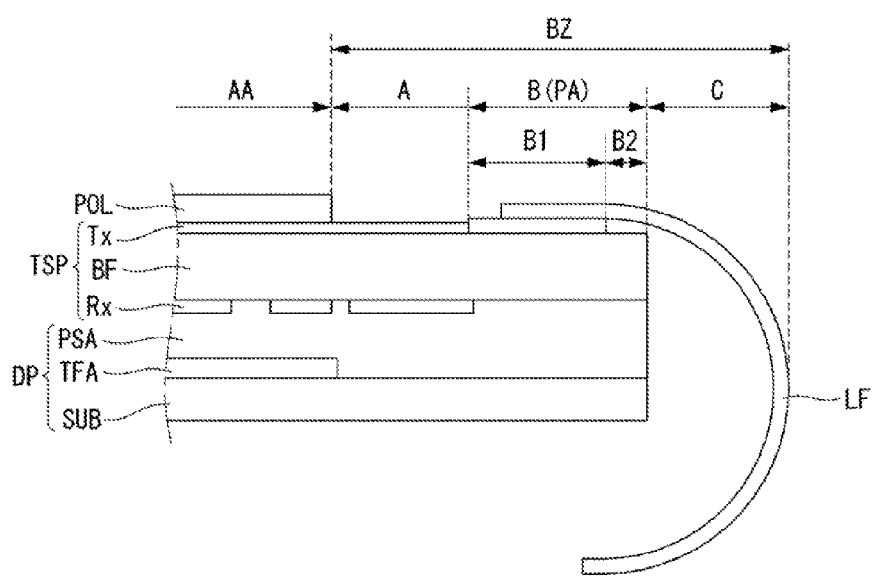
FIG. 2 is a view taken along line I-I' of FIG. 1, which is a cross-sectional view schematically illustrating an organic light-emitting diode display comprising a touch screen panel according to the related art.

The touch screen panel TSP1 according to the first exemplary embodiment of the present invention may have a narrower bezel area BZ than the touch screen panel TSP according to the related art. Referring back to FIG. 2, the organic light-emitting diode display according to the present invention should have space A between the polarizing film POL and the touch pads PD, space B1 to provide enough room to avoid poor contact with the terminals, taking into account process deviations, cutting margin space B2 required for a blanking process for forming the touch pads PD, and some space C between the edge of the base film BF1 and the flexible film LF. This space corresponds to the bezel area BZ. By contrast, in the present invention, the bezel area BZ corresponds to the distance D from the boundary between the display region AA and the non-display region NA to the part of the outer perimeter that protrudes most when the non-display region NA is bent. Moreover, in the present invention, the components of the bezel area BZ on the touch screen panel TSP according to the related art are placed on the back of the display region AA. Accordingly, in the present invention, the components do not constitute the bezel area BZ. Therefore, the first exemplary embodiment of the present invention can provide an organic light-emitting diode display which has a narrower bezel compared to the related art.

Referring to FIG. 5, the organic light-emitting diode display according to the first exemplary embodiment of the present invention comprises a display panel DP and a touch screen panel TSP1 located on the display panel DP. Further, a polarizing film POL for cutting reflection of light coming from the outside may be placed on the touch screen panel TSP1.

The display panel DP comprises a substrate SUB and a thin-film transistor array TFA formed on the substrate SUB. The substrate SUB comprises a display region AA where an input image is implemented and a non-display region NA located on the outside of the display region AA.

The substrate SUB is made of a flexible material selected from among polyethylene naphthalate (PEN), polyethylene terephthalate (PET), polyethylene ether phthalate, polycarbonate (PC), polyarylate, polyether imide, polyether sulfonate, polyimide, or polyacrylate. Further, a back plate BP made of a material such as PET may be attached to the bottom of the substrate SUB.

The thin-film transistor array TFA comprises pixels defined by data lines and gate lines. Each pixel comprises an organic light-emitting diode (hereinafter, "OLED"), which is a self-luminous element. The OLED comprises an anode, a cathode, and an organic compound layer interposed between the anode and cathode. The organic compound layer may comprise an emission layer EML, and may further comprise a common layer. The common layer may comprise at least one selected from the group consisting of a hole injection layer HIL, a hole transport layer HTL, an electron transport layer ETL, and an electron injection layer EIL.

Each pixel comprises a driving thin-film transistor that controls drive current flowing through the OLED depending on a gate-source voltage, a storage capacitor that keeps the gate-source voltage of the driving thin-film transistor constant for one frame, and at least one switching thin-film transistor that programs the gate-source voltage of the driving thin-film transistor response to a gate pulse (or scan pulse). The drive current is determined by the gate-source voltage of the driving thin-film transistor relative to a data voltage and the threshold voltage of the driving thin-film transistor, and the luminance of the pixels is proportional to the amount of drive current flowing through the OLED.

Further, a passivation layer may be formed to cover the thin-film transistors and the organic light-emitting diodes. The passivation layer may be composed of a multi-layer of one or more organic or inorganic materials alternately stacked upon one another. The passivation layer serves to protect internal elements in the display device from moisture and oxygen that may come from the outside environment and/or external force that may be provided from the outside.

The touch screen panel TSP1 is placed on the display panel DP. The display panel DP and the touch screen panel TSP1 are bonded together by an adhesive layer PSA interposed between them. The adhesive layer PSA may comprise a material that serves as a barrier to keep oxygen and moisture out.

As stated above, the touch screen panel TSP1 comprises a base film BF1 having a display region AA and a non-display region NA. The base film BF1 may function as an encapsulation substrate SUB of the organic light-emitting diode display.

The display region AA and non-display region NA of the base film BF1 correspond to the display region AA and non-display region NA of the substrate SUB constituting the display panel DP, respectively. The base film BF1 may be bent together with the substrate SUB of the display panel DP. Accordingly, the touch pads PD placed on one edge of the non-display region NA are located on the back of the display region AA.

The routing wires ERL1 are connected to the touch electrodes ER1 of the display region AA and extend along the outer perimeter of the display region NA. Since the routing wires ERL1 are provided in the bent non-display region NA, cracks or openings may be easily formed in them due to the stress of bending.

When the display device is bent, the neutral plane is located at the base film BF1. The neutral plane is the surface where the bending stress is zero. Tension stress or compressive stress is determined in proportion to the distance from the neutral plane when bending. Accordingly, the farther the distance from the neutral plane, the higher the tension stress or compressive stress. Moreover, elements placed in a region that is under the action of tension stress may develop cracks more easily than elements placed in a region that is under the action of compressive stress. That is, elements are more subject to cracks when they are under tension stress than under compressive stress.

The organic light-emitting diode display according to the first exemplary embodiment of the present invention further comprises micro cover layer (MCL) CL. In the first exemplary embodiment of the present invention, the location of the neutral plane may be adjusted by forming the micro cover layer CL. More specifically, the neutral plane may be located at or on the routing wires ERL1 by forming the micro cover layer CL. The thickness, material, etc. of the micro cover layer CL may be properly selected so as to adjust the location of the neutral plane. For example, the micro cover layer CL may be made of a material such as polymer.

In the first exemplary embodiment of the present invention, the possibility of cracks can be reduced by adjusting the location of the neutral plane so that the routing wires ERL1 are under no stress or less stress. Moreover, the micro cover layer CL may protect the routing wires ERL1, which are exposed as they are formed on the front of the base film BF1, from external force. For example, the micro cover layer CL may prevent direct friction between the routing wires ERL1 and external components and buffer the impact of external force.

Second Exemplary Embodiment

Figure 6:
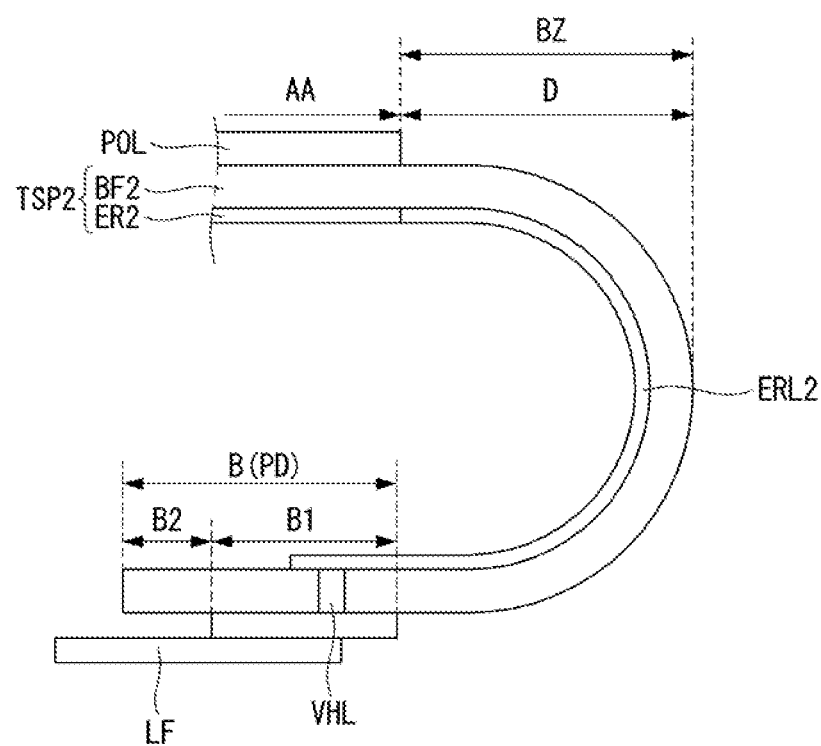
FIG. 6 is a view taken along line II-II' of FIG. 3, which is a cross-sectional view schematically illustrating a touch screen panel according to the present invention.
Figure 7:
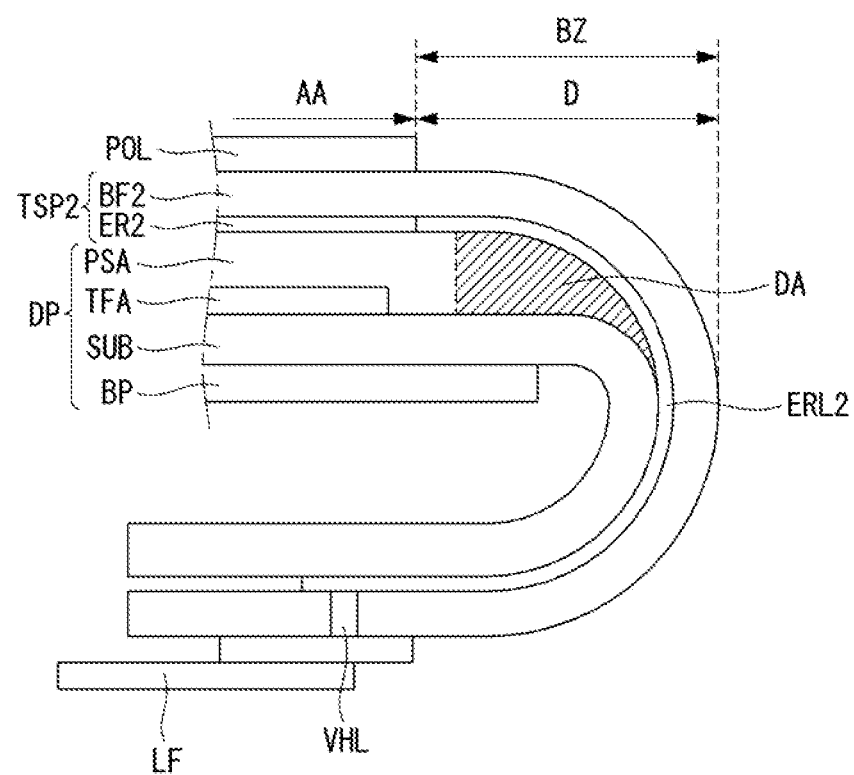
FIG. 7 is a view taken along line II-II' of FIG. 3, which is a cross-sectional view schematically illustrating an organic light-emitting diode display comprising a touch screen panel according to the present invention.

Hereinafter, a touch screen panel TSP2 and an organic light-emitting diode display comprising the same according to a second exemplary embodiment of the present invention will be described with reference to FIGS. 6 and 7. FIG. 6 is a view taken along line II-II' of FIG. 3, which is a cross-sectional view schematically illustrating a touch screen panel according to the present invention. FIG. 7 is a view taken along line II-II' of FIG. 3, which is a cross-sectional view schematically illustrating an organic light-emitting diode display comprising a touch screen panel according to the present invention.

Referring to FIG. 6, the touch electrodes ER2 and the routing wires ERL2 connected to the touch electrodes ER2 according to the second exemplary embodiment of the present invention are in different locations than those according to the first exemplary embodiment.

The base film BF2 comprises a display region AA and a non-display region NA located on the outside of the display region AA. The touch electrodes ER2 are placed on the back of the base film BF2 in the display region AA. The touch pads PD are placed on the front of one edge of the base film BF2, in the non-display region NA. The routing wires ERL2 are placed on the back of the base film BF2. One end of the routing wires ERL2 is connected to the touch electrodes ER2, and the other end is connected to the touch pads PD.

A via hole VHL running through the base film BF2 is formed on one edge of the non-display region NA of the base film BF2. A conductive material is filled in the via hole VHL. The routing wires ERL2 placed on the back of the non-display region NA are in contact with the conductive material filled in the via hole VHL on one edge of the non-display region NA. The touch pads PD placed on the front of the non-display region NA are in contact with the conductive material filled in the via hole VHL on one edge of the non-display region NA. The routing wires ERL2 are electrically connected to the touch pads PD placed on the front of the base film BF2 through the via hole VHL. The touch pads PD are bonded to the flexible film LF to receive a touch signal from the touch integrated circuit. In another example, the conductive material filled in the via hole VHL may function as the touch pads PD, in which case the conductive material filled in the via hole VHL and the flexible film LF may be electrically connected as they come into direct contact with each other.

The non-display region NA of the base film BF2 may extend from the display region AA and be bent towards the back of the display region AA. The display region AA of the base film BF2 maintains the planar shape. The touch pads PD are located on the back of the display region AA. Accordingly, the flexible film LF connected to the touch pads PD may be placed opposite the back of the display region AA. The routing wires ERL2 extend along the inner perimeter of the non-display region NA and are connected to the touch pads PD.

The touch screen panel TSP2 according to the second exemplary embodiment of the present invention may have a narrower bezel area BZ than the touch screen panel TSP according to the related art. Referring back to FIG. 2, the organic light-emitting diode display according to the present invention should have space A between the polarizing film POL and the touch pads PD, space B1 to provide enough room to avoid poor contact with the terminals, taking into account process deviations, cutting margin space B2 required for a blanking process for forming the touch pads PD, and some space C between the edge of the base film BF2 and the flexible film LF. This space corresponds to the bezel area BZ. By contrast, in the present invention, the bezel area BZ corresponds to the distance D from the boundary between the display region AA and the non-display region NA to the part of the outer perimeter that protrudes most when the non-display region NA is bent. Moreover, in the present invention, the components of the bezel area BZ on the touch screen panel TSP according to the related art are placed on the back of the display region AA. Accordingly, in the present invention, the components do not constitute the bezel area BZ. Therefore, the second exemplary embodiment of the present invention can provide an organic light-emitting diode display which has a narrower bezel compared to the related art.

Referring to FIG. 7, the organic light-emitting diode display according to the second exemplary embodiment of the present invention comprises a display panel DP and a touch screen panel TSP2 located on the display panel DP. Further, a polarizing film POL for cutting reflection of light coming from the outside may be placed on the touch screen panel TSP2.

The display panel DP comprises a substrate SUB and a thin-film transistor array TFA formed on the substrate SUB. The substrate SUB comprises a display region AA where an input image is implemented and a non-display region NA located on the outside of the display region AA.

The touch screen panel TSP2 is placed on the display panel DP. The display panel DP and the touch screen panel TSP2 are bonded together by an adhesive layer PSA interposed between them. The adhesive layer PSA may comprise a material that serves as a barrier to keep oxygen and moisture out.

As stated above, the touch screen panel TSP2 comprises a base film BF2 having a display region AA and a non-display region NA. The base film BF2 may function as an encapsulation substrate SUB of the organic light-emitting diode display.

The display region AA and non-display region NA of the base film BF2 correspond to the display region AA and non-display region NA of the substrate SUB constituting the display panel DP, respectively. The base film BF2 may be bent together with the substrate SUB of the display panel DP. Accordingly, the touch pads PD placed on one edge of the non-display region NA are located on the back of the display region AA. The routing wires ERL2 are provided in the non-display region NA, with one side being connected to the touch electrodes ER2 and the other side being connected to the touch pads PD.

Since the routing wires ERL2 are provided in the bending area, cracks or openings may be easily formed in them due to the stress of bending.

When the display device is bent, the neutral plane is located at the base film BF2. The neutral plane is the surface where the bending stress is zero. Tension stress or compressive stress is determined in proportion to the distance from the neutral plane when bending. Accordingly, the farther the distance from the neutral plane, the higher the tension stress or compressive stress. Moreover, elements placed in a region that is under the action of tension stress may develop cracks more easily than elements placed in a region that is under the action of compressive stress. That is, elements are more subject to cracks when they are under tension stress than under compressive stress.

In the second exemplary embodiment of the present invention, the routing wires ERL2 may be located under the neutral plane by forming the routing wires ERL2 on the back of the base film BF2. The routing wires ERL2, located under the neutral plane, are under compressive tension, this may prevent cracks effectively, compared to when they are located on the front of the base film BF2 and under tension stress. Moreover, in the second exemplary embodiment of the present invention, the neutral plane may be located at the routing wires ERL2 or as close as possible to the routing wires ERL2 by adjusting the thickness of the base film BF2. The thickness of the base film BF2 may be selected by taking into account deformation resistance, etc., which varies depending on the thickness thereof and location of the neutral plane.

In the second exemplary embodiment of the present invention, the possibility of cracks can be reduced by adjusting the location of the neutral plane so that the routing wires ERL2 are under no stress or less stress.

Third Exemplary Embodiment

Figure 8:
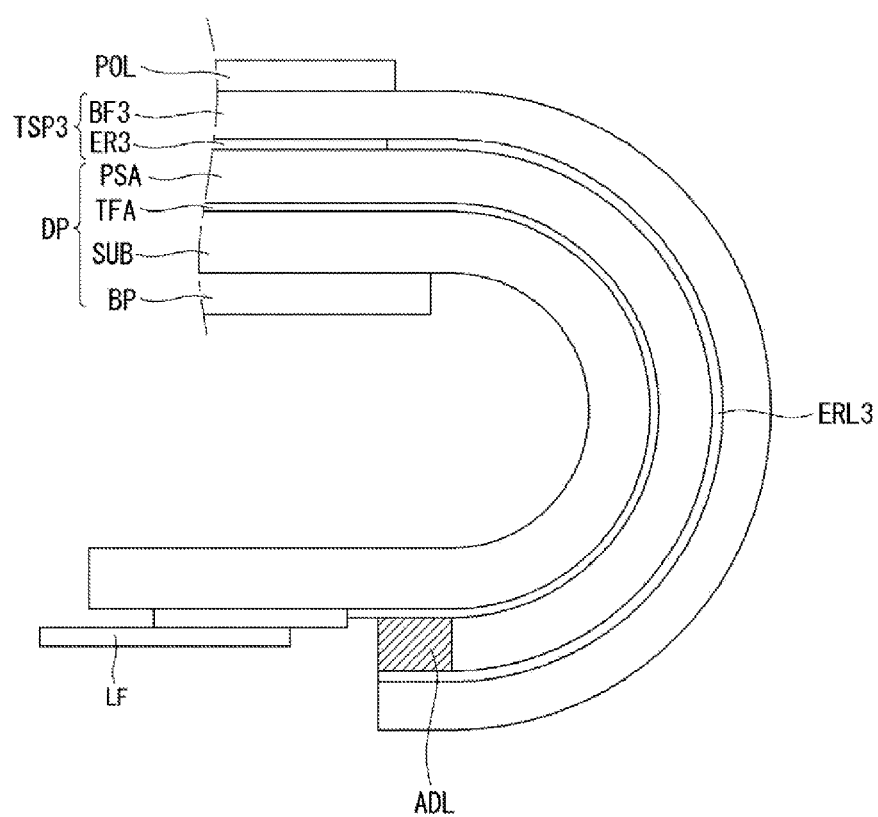
FIGS. 8 to 10 are views for explaining an organic light-emitting diode display comprising a touch screen panel according to an embodiment of the present invention.
Figure 9:
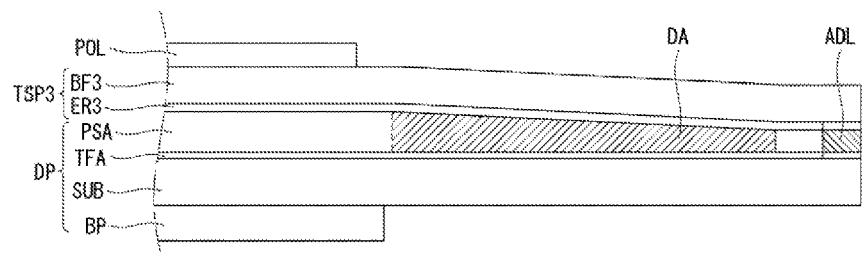
Figure 9:
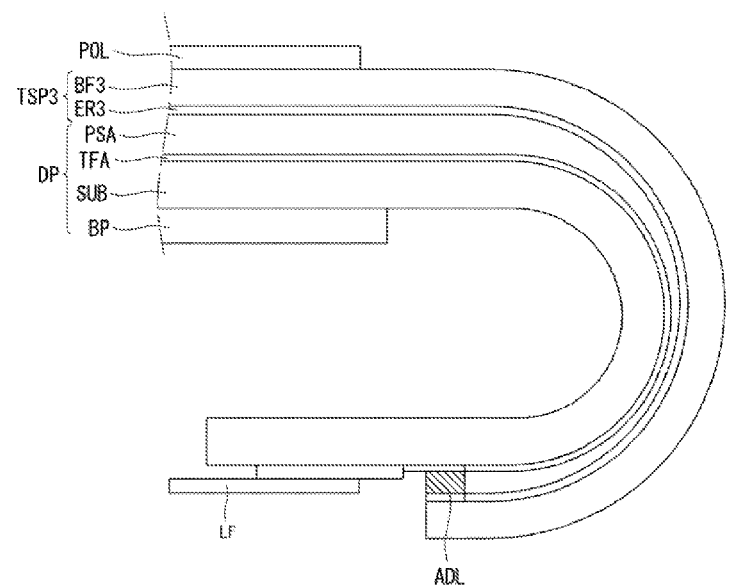
Figure 10:
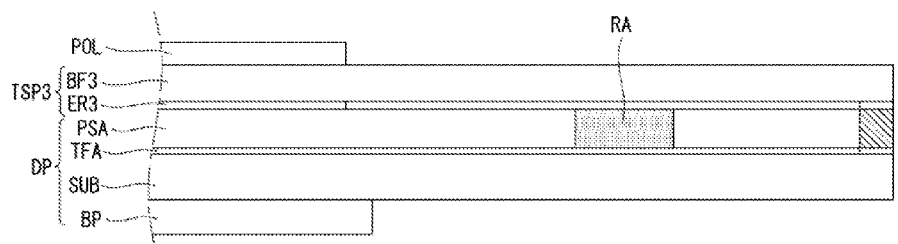
Figure 10:
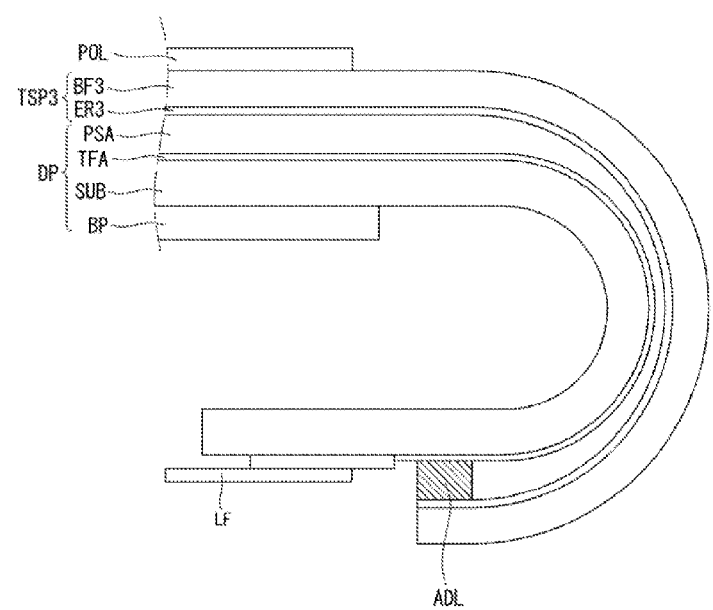

Hereinafter, a touch screen panel TSP3 and an organic light-emitting diode display comprising the same according to a third exemplary embodiment of the present invention will be described with reference to FIGS. 8 to 10. FIGS. 8 to 10 are views for explaining an organic light-emitting diode display comprising a touch screen panel according to the third exemplary embodiment of the present invention.

Referring to FIG. 8, the routing wires ERL3 are connected to the touch electrodes ER3 of the display region AA and extend along the inner perimeter of the non-display region NA. The touch pads PD are formed in the thin-film transistor array TFA. The routing wires ERL3 are electrically connected to the touch pads PD placed in the thin-film transistor array TFA through a conductor ADL. The conductor ADL may be an ACF (anisotropic conductive film) or ACP (anisotropic conductive paste). In this case, a touch integrated circuit for sensing touch input and a display driver circuit for implement an input image may be placed at the same location (or close to each other). The touch integrated circuit is electrically connected to the routing wires ERL3 of the touch screen panel TSP3 through the pads formed in the thin-film transistor array TFA.

Referring to FIG. 9, the organic light-emitting diode display comprises an adhesive layer PSA interposed between the display panel DP and the touch screen panel TSP3. The adhesive layer PSA comprises a variable-thickness area DA, which becomes gradually thinner towards one edge of the non-display region NA. The variable-thickness area DA is located in the non-display region NA. In the variable-thickness area DA, the thickness of the adhesive layer PSA may vary linearly. The variable-thickness area DA may be positioned to cover most of the non-display region NA, as shown in FIG. 9, or to cover only part of the non-display region NA, as shown in FIGS. 5 and 7. In this example, (a) of FIG. 9 illustrates the non-display region NA before bending, which is a view showing an example of the shape of the adhesive layer PSA comprising the variable-thickness area DA. Further, (b) of FIG. 9 illustrates the non-display region NA after bending, which is a view showing a bending area which has a reduced thickness by comprising the variable-thickness area DA.

Referring further to FIG. 10, the organic light-emitting diode display comprises an adhesive layer PSA interposed between the display panel DP and the touch screen panel TSP3. The adhesive layer PSA comprises a thickness removal area RA. The thickness removal area RA refers to a portion that part or the entire of thickness of the adhesive layer PSA is removed. The thickness removal area RA is located in the non-display region NA. The adhesive layer PSA may comprise one or more thickness removal areas RA. Here, (a) of FIG. 10 illustrates the non-display region NA before bending, which is a view showing an example of the shape of the adhesive layer PSA comprising the thickness removal area RA. Further, (b) of FIG. 10 illustrates the non-display region NA after bending, which is a view showing a bending area which has a reduced thickness by comprising the thickness removal area RA.

The organic light-emitting diode display according to the third exemplary embodiment of the present invention can be made thinner in the bending area by varying the shape of the adhesive layer PSA. Therefore, the third exemplary embodiment of the present invention makes it easy to bend the non-display region NA, without deformation resistance due to thickness.

Increasing the thickness of the non-display region NA may bring about the problem of increased bezel area BZ. The third exemplary embodiment of the present invention can achieve a narrow bezel by reducing the thickness of the bending area.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch screen panel comprising:
a base film having a display region and a bent non-display region located on an outside of the display region, the base film having an outer surface and an inner surface;
touch electrodes provided in the display region;
touch pads provided on one edge of the base film and on a back of the display region;
routing wires that extend along a front of the bent non-display region and electrically connect the touch electrodes and the touch pads; and
a driving portion electrically connected to the touch pads,
wherein the driving portion includes a touch integrated circuit transmitting signals to the touch electrodes,
wherein the driving portion is provided at the outer surface of the base film, at the one edge of the base film, and on the back of the display region, and
wherein the touch electrodes are placed on the outer surface of the base film, and further comprise a micro cover layer (MCL) that covers the routing wires extending from the touch electrodes along the front of the bent non-display region.

2. The touch screen panel of claim 1, wherein the driving portion includes a flexible film electrically connected to the touch pads and located on the back of the display region.

3. The touch screen panel of claim 1,
wherein the touch electrodes are provided at the outer surface of the base film,
wherein the touch pads have a first section and a second section, the second section being further from the touch electrodes along the base film than the first section, and the second section of the touch pads extending from the one edge of the base film to the first section of the touch pads, and
wherein the driving portion includes a flexible film at the outer surface of the base film over the second section of the touch pads, the flexible film having one section in contact with the first section of the touch pads and another section spaced from the second section of the touch pads by a gap.

4. A touch screen panel comprising:
a base film having a display region and a bent non-display region located on an outside of the display region, the base film having an outer surface and an inner surface;
touch electrodes provided in the display region;
touch pads provided on one edge of the base film and on a back of the display region;
routing wires that extend along a back of the bent non-display region and electrically connect the touch electrodes and the touch pads;
a driving portion electrically connected to the touch pads; and
a via hole that is formed on the one edge of the bent non display region base film and penetrates the base film,
wherein the driving portion includes a touch integrated circuit transmitting signals to the touch electrodes,
wherein the driving portion is provided at the outer surface of the base film, and at the one edge of the base film, and on the back of the display region, and
wherein the touch electrodes are placed on the inner surface of the base film, and the routing wires extending from the touch electrodes along the back of the bent non-display region are electrically connected to the touch pads placed on the outer surface of the base film, through the via hole.

5. The touch screen panel of claim 4, wherein the driving portion includes a flexible film electrically connected to the touch pads and located on the back of the display region.

6. An organic light-emitting diode display comprising:
a display panel having a first display region and a first bent non-display region located on an outside of the first display region and further comprising a thin-film transistor array that has thin-film transistors located on a substrate and organic light-emitting diodes electrically connected to the thin-film transistors;
a touch screen panel having a second display region corresponding to the first display region and a second bent non-display region corresponding to the first bent non-display region; and
an adhesive layer interposed between the display panel and the touch screen panel,
wherein the organic light-emitting diode display further comprises:
a base film that is bent together with the substrate, in the second bent non-display region, the base film having an outer surface and an inner surface;
touch electrodes provided on a back of the second display region, and at the outer surface of the base film;
touch pads provided on one edge of the substrate in the thin-film transistor array, and on a back of the first display region;

routing wires extending from the touch electrodes along a back of the second bent non-display region and electrically connect the touch electrodes and the touch pads; and a driving portion electrically connected to the touch pads and provided on the back of the first display region, wherein the driving portion includes a touch integrated circuit transmitting signals to the touch electrodes, and wherein the routing wires are electrically connected to the touch pads through a conductor in the first bent non-display region.

7. The organic light-emitting diode display of claim 6, wherein the adhesive layer comprises a variable-thickness area in the second bent non-display region, which becomes gradually thinner towards one edge of base film.

8. The organic light-emitting diode display of claim 6, wherein the adhesive layer comprises a thickness removal area, and wherein the thickness removal area is a portion that a part or the entire thickness of the adhesive layer is removed.

9. The organic light-emitting diode display of claim 6, wherein the touch electrodes are provided at the outer surface of the base film, wherein the touch pads have a first section and a second section, the second section being further from the touch electrodes along the base film than the first section, and the second section of the touch pads extending from one edge of the base film, and adjacent the first bent non-display region or the second bent non-display region to the first section of the touch pads, and wherein the driving portion includes a flexible film at the outer surface of the base film over the second section of the touch pads, the flexible film having one section in contact with the first section of the touch pads and another section spaced from the second section of the touch pads by a gap.

10. The organic light-emitting diode display of claim 6, wherein the driving portion includes a flexible film electrically connected to the touch pads.

* * * * *